United States Patent
Kuroda et al.

(10) Patent No.: US 10,412,870 B2
(45) Date of Patent: Sep. 10, 2019

(54) BOARD WORK MACHINE

(71) Applicant: FUJI CORPORATION, Chiryu-shi (JP)

(72) Inventors: Hideya Kuroda, Toyota (JP); Masahiro Takeda, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 94 days.

(21) Appl. No.: 15/531,479

(22) PCT Filed: Dec. 18, 2014

(86) PCT No.: PCT/JP2014/083603
§ 371 (c)(1),
(2) Date: May 30, 2017

(87) PCT Pub. No.: WO2016/098231
PCT Pub. Date: Jun. 23, 2016

(65) Prior Publication Data
US 2017/0265343 A1   Sep. 14, 2017

(51) Int. Cl.
*B23P 19/00* (2006.01)
*H05K 13/08* (2006.01)
*H05K 13/04* (2006.01)
*H05K 1/02* (2006.01)
(Continued)

(52) U.S. Cl.
CPC ........... *H05K 13/08* (2013.01); *H05K 1/0269* (2013.01); *H05K 3/0097* (2013.01);
(Continued)

(58) Field of Classification Search
CPC .. H05K 13/08; H05K 13/0812; H05K 3/0097; H05K 1/0269; H05K 13/0015;
(Continued)

(56) References Cited

U.S. PATENT DOCUMENTS 6,683,688 B1 *   1/2004   Schiebel .............. H05K 13/089
                                                    356/399
2003/0059964 A1   3/2003   Kawai et al.

FOREIGN PATENT DOCUMENTS

JP    2003-101300 A    4/2003
JP    2009-27202 A     2/2009
JP    2012-64833 A     3/2012

OTHER PUBLICATIONS

English Translation of JP 2003101300 Kawai.*
(Continued)

*Primary Examiner* — Thiem D Phan
(74) *Attorney, Agent, or Firm* — Oblon, McClelland, Maier & Neustadt, L.L.P.

(57) ABSTRACT

In a board work machine that performs board work with reference to a reference mark provided on a board, in a case of performing board work with respect to a board provided with overall reference mark and local area reference mark that acts as a reference for a local area as reference marks, when recognizing the reference marks by imaging, checking is performed as to whether a recognized reference mark is recognized correctly. For this checking, when checking whether the position deviation amount from a normal position and the relative position deviation amount of an imaging target identified as a reference mark is within the range of a set tolerance, set tolerances for a local area reference mark are smaller than set tolerances for an overall reference mark.

3 Claims, 4 Drawing Sheets

(51) Int. Cl.
*H05K 13/00* (2006.01)
*H05K 3/00* (2006.01)

(52) U.S. Cl.
CPC ......... *H05K 13/0015* (2013.01); *H05K 13/04* (2013.01); *H05K 13/0812* (2018.08); *Y10T 29/53174* (2015.01)

(58) Field of Classification Search
CPC .. H05K 13/04; H05K 13/0413; H05K 1/0266; Y10T 29/53174; Y10T 29/53178; Y10T 29/53191; Y10T 29/53183; Y10T 29/53261; Y10T 29/53539; H01L 21/68; H03L 1/026
USPC ...... 29/739, 25.01, 428, 709, 729, 740, 832, 29/834
See application file for complete search history.

(56) References Cited

OTHER PUBLICATIONS

Extended European Search Report dated Nov. 6, 2017 in Patent Application No. 14908441.0.
Nick Mescia, et al., "IPC-7351 Generic Requirements for Surface Mount Design and Land Pattern Standard" Retrieved from the Internet: URL:http://pcbget.ru/Files/Standarts/IPC_7351.pdf, XP055418933, Feb. 28, 2005, 92 Pages.
International Search Report dated Feb. 3, 2015, in PCT/JP2014/083603, filed Dec. 18, 2014.
Office Action dated Oct. 11, 2018 in Japanese Patent Application No. 2016-564534 (with unedited computer generated English translation).

* cited by examiner

BOARD WORK MACHINE

TECHNICAL FIELD

The present application relates to a board work machine that performs work on a board such as a component mounter that mounts electronic components on a board.

BACKGROUND ART

With board work machines such as a component mounter, a board is fixed by a board fixing device, and board work such as mounting of electronic components, application of adhesive, and inspection is performed with respect to the fixed board. This board work is performed based on the position of the board fixed by the board fixing device (hereinafter also referred to as a fixing position), and in many board work machines the fixing position is acquired from an imaging result obtained by imaging reference marks provided on the board using an imaging device. In other words, board work is performed with reference to recognized reference marks. However, as disclosed in the patent literature below, for some boards, because of reasons such as that improved accuracy of board work is required, as well as being provided with overall reference marks that provide a position reference for the board overall, boards are provided with local area reference marks that provide a reference to a partial area (hereinafter also referred to as a local area) of the board, and board work in that local area is performed using the local area reference marks as a reference.

CITATION LIST

Patent Literature

Patent Literature 1
JP-A-2003-101300

SUMMARY

Various items are provided or displayed on the surface of a board, such as lands of a printed circuit, and when recognizing reference marks using imaging, processing is performed to check that the imaging target is a reference mark, that is, to check that the reference mark that should be recognized is recognized. It is desirable for this checking processing to be performed accurately, especially for boards provided with both overall reference marks and local area reference marks, as these boards have a large number of reference marks, and may require high accuracy of board work; for reasons such as these, satisfying the above demands is linked to the improvement of the practicality of board work machines. The present disclosure is made in view of the above-described circumstances, and an object thereof is to provide a highly practical board work machine.

To solve the above problems, a board work machine of the present disclosure includes:
 a board fixing device configured to fix a board;
 a board work device configured to perform work with respect to the board fixed by the board fixing device;
 an imaging device configured to image a surface of the board fixed by the board fixing device;
 a control device configured to recognize an imaging target as a reference mark in a case in which a position deviation amount of the imaging target imaged by the imaging device is within a set tolerance range, and control the board work device to perform work using the recognized reference mark as a reference, wherein,
 in a case in which the board fixed by the fixing device is a board provided with an overall reference mark that represents a reference of the board overall and a local area reference mark that represents a reference of a local area, the set tolerance range for recognizing the local area reference mark is smaller than the set tolerance for recognizing the overall reference mark.

Note that, the above "imaging target" refers to an item within a captured image identified as a reference mark, and "position deviation amount of the imaging target", assuming that the imaging target is a reference mark, refers to the deviation amount of the position of the imaging target from the position at which the reference mark should exist (also referred to as "normal position", "theoretical position", and so on). Note also that, "work performed with respect to a fixed board", or "board work", refers to various work, such as component mounting work, adhesive application work performed before the mounting work, inspection work of inspecting mounting work results, and so on; similarly, "board work device" refers to various devices, such as a component mounting device, an adhesive applying device, an inspection device, or the like, and "board work machine" refers to various machines, such as a component mounter, an adhesive applying machine, an inspection machine, and the like. Further, "local area", for example, refers to one of multiple sub-boards for a case in which one board is configured from multiple sub-boards that have the same circuit pattern. Also, for example, with regard to mounting of a component that requires particular accuracy, reference marks are provided near the component, and mounting of that component is performed with reference to those reference marks; in such a case, the area where that component is mounted and the nearby area corresponds to the local area.

With a board work machine of the present disclosure as given above, it is desirable that,
 in a case in which the board fixed by the board fixing machine is a board on which a pair of overall reference marks separated from each other is provided as the overall reference mark, and a pair of local area reference marks that are separated from each other is provided with respect to one local area as the local area reference mark,
 the set tolerance for recognizing the overall reference mark, as a set tolerance of the relative position deviation amount of the pair of overall marks, includes a set tolerance with respect to a separation distance of the pair of overall reference marks, and the set tolerance for recognizing the local area reference marks, as a set tolerance of the relative position deviation amount of the pair of local area reference marks, includes a set tolerance with respect to a separation distance of the pair of local areas reference marks, and
 the set tolerance with respect to the separation distance of the pair of local areas reference marks is smaller than the set tolerance with respect to the separation distance of the pair of overall reference marks.

In such a case, for a board work machine of the present disclosure, it is desirable that
 the set tolerance with respect to the separation distance of the pair of overall reference marks and the set tolerance with respect to the separation distance of the pair of local areas reference marks are set to a size according to the respective separation distance of each.

Effects

Because many board fixing devices fix a board that has been stopped by a conveyor device, based on the stopping accuracy of the conveyor device, the fixing position of the board fixed by the board fixing device (including "rotational position", that is, "rotational angle", "direction") may be thought to have a relatively large deviation. Taking this into consideration, there should be tolerance for a relatively large position deviation of overall reference marks, thus, in a board work machine of the present disclosure, the set tolerance for recognizing the above overall reference marks is large. If an overall reference mark has been recognized, the position of the board overall can be understood from that overall reference mark, and each position on the board, that is, coordinates on the board (hereinafter also referred to as "reference coordinates") are decided, and based on those coordinates, for recognizing a local area reference mark, the position deviation of the local area reference mark is relatively small. Taking this into consideration, in a board work machine of the present disclosure, the set tolerance for recognizing the local area reference marks is small. Also, because the local area is a relatively small area, there are cases in which an item that may be misrecognized as a local area reference mark is taken as the imaging target. Considering this also, to prevent such misrecognition, the set tolerance for recognizing local area reference marks is small. From the above, according to a board work machine of the present disclosure, the above recognition processing of reference marks, that is, processing for checking that recognized reference marks have been correctly recognized, is performed reliably.

Also, generally, for an overall reference mark, to acquire the rotational position of the board, in many cases a pair of overall reference marks are provided at diagonally opposite positions on an outer edge of the board; on the other hand, for a local area reference mark, to acquire the rotational position of the local area, in many cases a pair of local area reference marks are provided at diagonally opposite positions on an outer edge of the local area. In such cases, as recognition processing of a reference mark, the deviation of the separation distance of the pair of reference marks, that is, the deviation amount of the relative position of the pair of reference marks is effective as a parameter for reference mark recognition processing. In detail, for example, for a warpable board, that is, for a flexible board, it is particularly effective to perform reference mark recognition processing considering the board warpage. With such a board, the deviation amount of the separation distance between the pair of overall reference marks may be considered relatively large, but the deviation amount of the separation distance between the pair of local area reference marks may be considered relatively small, as in many cases the local area is relatively small. Considering this, it is desirable that the set tolerance with respect to the separation distance of a pair of local area reference marks be smaller than the set tolerance of the separation distance of the pair of overall reference marks. By setting the separation distance between the pair of reference marks as such, reference mark check processing can be performed more reliably.

It is desirable that the allowable deviation amount of the separation distance between the pair of reference marks is decided according to the size of the separation distance. That this, it is desirable to have a larger tolerance for a larger separation distance, and a smaller tolerance for a smaller separation distance. In this way, by setting the set tolerance with respect to the separation distance of the pair of reference marks to a size according to that separation distance, reference mark check processing can be performed more reliably.

DESCRIPTION OF EMBODIMENTS

Herein, a component mounter that mounts electronic components on a circuit board will be described in detail with reference to the drawings as a representative embodiment of the present disclosure. Note that, for the present disclosure, as well as the below embodiment, embodiments with various changes based on the knowledge of someone skilled in the art are possible.

EMBODIMENTS

[A] Configuration of Component Mounter

Figure 1:
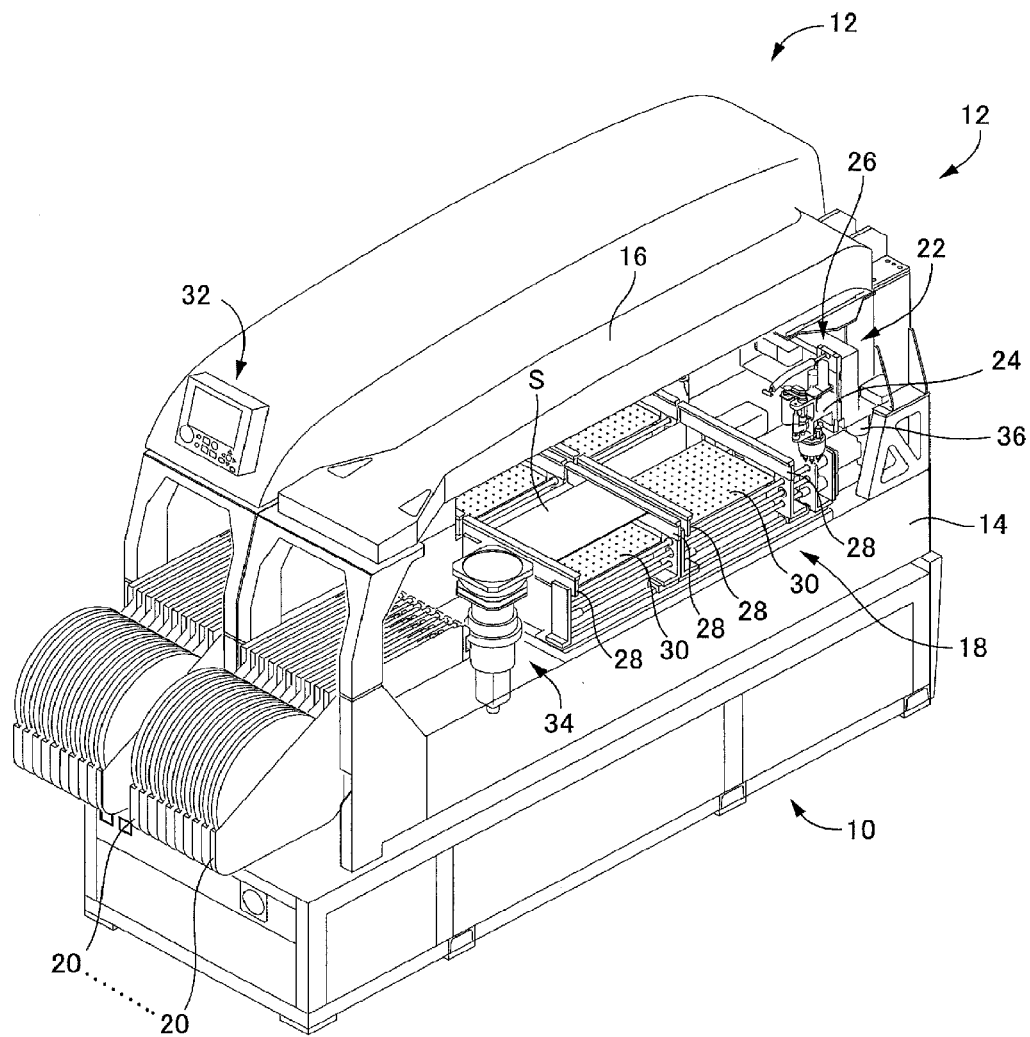
FIG. 1 shows the overall configuration of a component mounter as an embodiment of a board work machine of the present disclosure.

The component mounter of the embodiment is assembled on the component mounting system shown in FIG. 1, and that system is configured including system base 10, and two component mounters arranged adjacently on system base 10. The two component mounters 12 have the same configuration as each other, and each is a component mounter as the board work machine of the embodiment.

Component mounter 12 is provided with base 14, and main body configured from frame 16 arranged on base 14. Conveyor 18 is arranged on a central portion of base 14 in the front-rear direction, and multiple component feeders 20 that each function as a component supply device are arranged on a front section of base 14 lined up in a left-right direction. Also, component mounting device 22 is supported on frame 16 as a board work device. Component mounting device 22 is configured including mounting head 24 that has a suction nozzle as a component holding device, and head moving device 26 that moves mounting head 24 forwards, backwards, left, right, up, and down.

Conveyor device 18 conveys boards in a left-right direction in two lanes, front and rear, with each lane being provided with a pair of support plates 28, which revolvably support conveyor belts (not shown), established facing each other in the front-rear direction, and raising and lowering table 30 for lifting up the board from beneath provided between the pair of support plates 28. Board S is conveyed in a left-right direction by the conveyor belts, and for board mounting work, a board S conveyed to a set position is fixed in a state engaged with the upper edges of each of the pair of support plates 28 by raising and lowering table 30 being raised. That is, conveyor 18 functions as a board fixing device that fixes a board S for component mounting work to be performed.

Component mounting work is performed with mounting head 24 being moved by head moving device 26 between component feeders 20 and board S fixed by conveyor device 18. In detail, mounting head 24 picks up and holds a component supplied from component feeder 20 using a suction nozzle, and loads the held component on board S fixed by conveyor device 18. Control of conveyor device 18, component feeder 20, component mounting device 22, and so on during component mounting work is performed by control device 32 that is integrated with an operation panel.

Details are described later, but component camera 34 is provided between conveyor device 18 and component feeder 20, and a component held by mounting head 24 is imaged by component camera 34, and by processing the captured image, the deviation amount of the holding position of the component is acquired, and loading of the component on the board S is performed considering that deviation amount. Further, board camera 36 that images the surface of board S is provided together with mounting head 24, and is thus moved together with mounting head 24 by head moving device 26. Board camera 36 that functions as an imaging device, during component mounting work, images reference marks provided on board S, and by processing those captured images, the deviation amount of the position of board S, that is, the deviation amount of the fixing position, is acquired, and loading of the component on board S is performed considering that deviation amount. The image processing and acquiring of the deviation amount are performed by control device 32.

[B] Board and Reference Marks Provided on the Board

Figure 2:
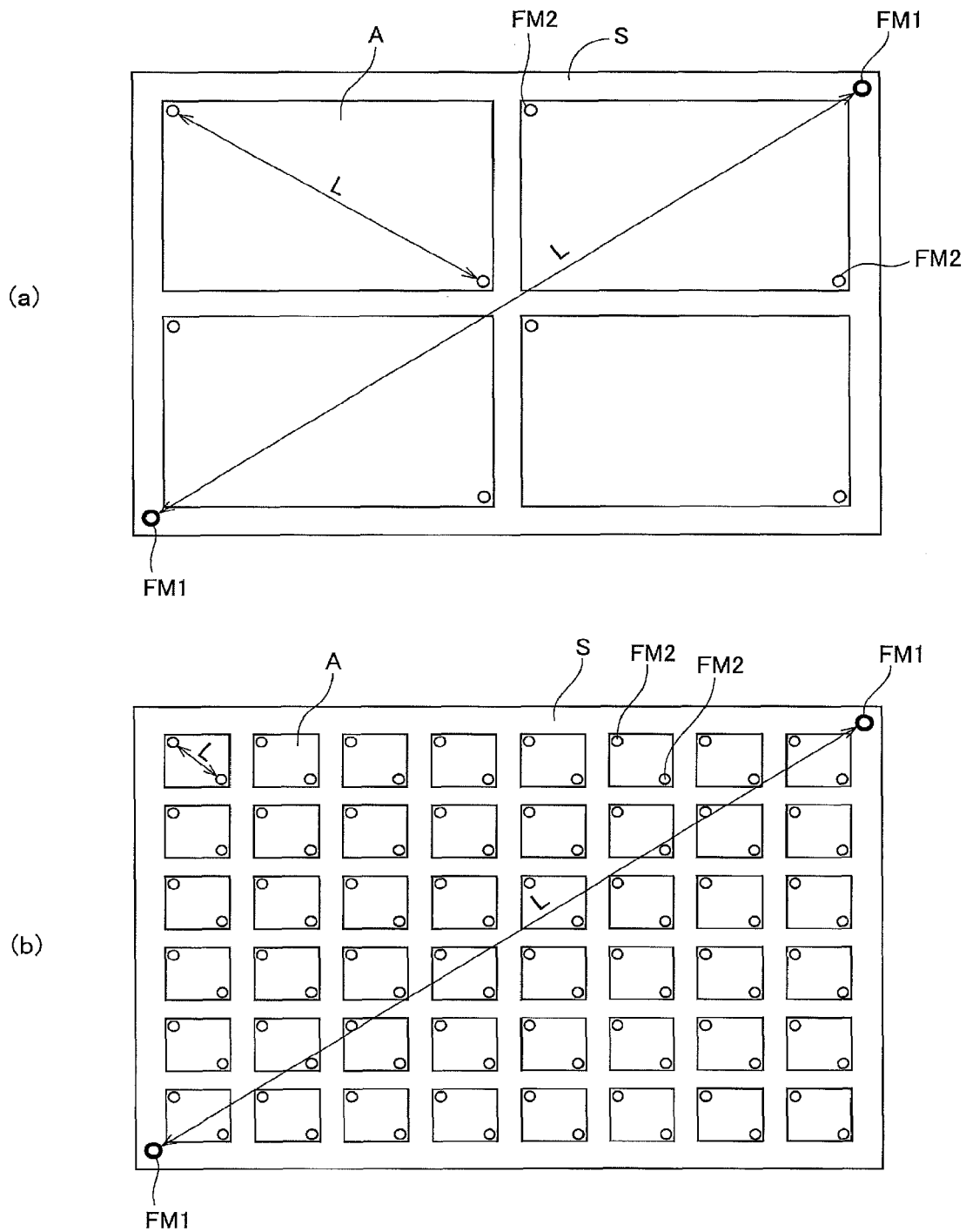
FIG. 2 conceptually shows a board on which component mounting work is performed as board work using an embodiment of a component mounter.

An example of a board on which component mounting work is performed by component mounter 12 is shown in FIGS. 2A and 2B. Boards S shown in FIG. 2 are so-called multi-boards that have multiple sub-boards assembled together. In other words, boards S are provided with multiple local areas that each have the same circuit pattern. Specifically, on board S shown in FIG. 2A, four local areas A are provided in a matrix of two rows by two columns, and on board S shown in FIG. 2B, forty-eight local areas A are provided in a matrix of six rows and eight columns.

As described above, components are loaded by component mounting device 22 on board S fixed by conveyor device 18, and variance arises in the position of board S fixed by conveyor 18, that is, in the fixing position, due to factors such as the stopping accuracy during conveyance by conveyor 18 and the clearance in the front-rear direction. Specifically, deviation arises in the front-rear direction position, the left-right direction position, and the rotational direction position (rotational angle, direction). Reference marks are provided on board S because it is necessary to consider this deviation when performing component mounting work.

Specifically, for the boards S in both FIGS. 2A and 2B, pair of reference marks FM1 are provided at the upper right corner and lower left corner of board S, and for each local area A, pair of reference marks FM2 are provided at the upper left corner and lower right corner of local area A. Reference marks FM1 are for understanding the overall position of board S, and are also referred to as overall reference marks. On the other hand, reference marks FM2 are marks used as a reference for loading a component in local area A, and are also referred to as local area reference marks. Local area reference marks FM2 are provided for improving the mounting position accuracy of a component in a local area A.

[C] Recognition of Reference Marks

Figure 3:
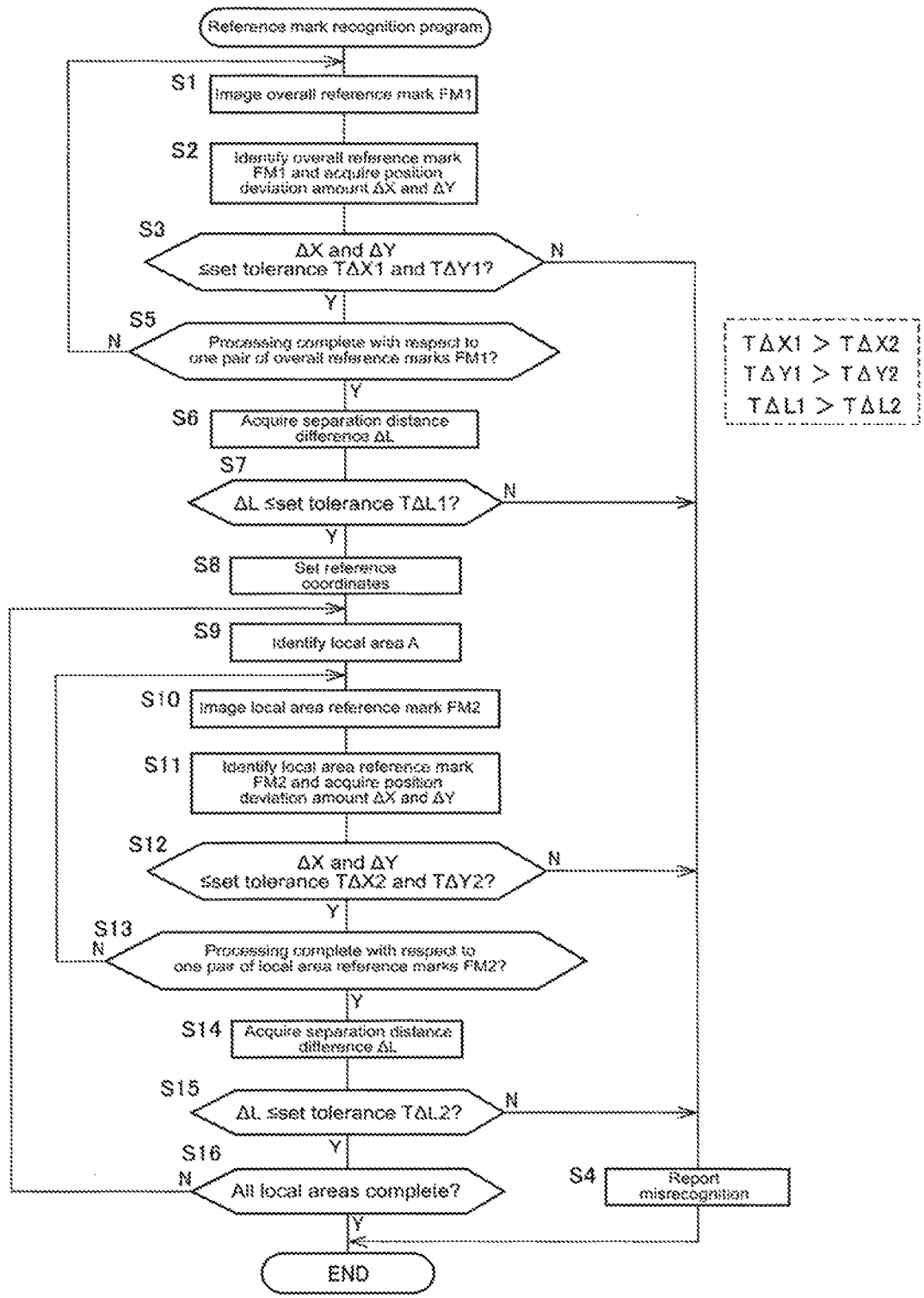
FIG. 3 is a flowchart showing reference mark recognition processing performed by the component mounter of the embodiment.

Processing for recognizing reference marks is performed after the board is fixed by conveyor device 18 and before the component is loaded on the board. In detail, processing is performed by control device 32 running the reference mark recognition program shown in the flowchart of FIG. 3.

With processing according to this program, first, in step 1 (hereinafter abbreviated to S1, which also applies to the other steps), one of the pair of overall reference marks FM1 is imaged. In detail, imaging of the reference mark is performed by board camera 36 being moved above the reference mark by head moving device 26. The position to which board camera 36 is moved is a position at which a theoretical position at which the reference mark should exist (hereinafter also referred to as a "normal mark position") is in the center of the field of view of board camera 36. In a case of overall reference mark FM1, overall reference mark FM1, that is, the position at which overall reference mark FM1 should exist in a case in which it is assumed that the board is fixed in the correct position (theoretical position), is the normal mark position, and an example of an image imaged by board camera 36 in this case is shown in FIG. 4.

Next, in S2, based on data of the image imaged in S1, overall reference mark FM1 is identified, and, along with the positions X and Y of the overall reference mark FM1, the position deviation amounts $\Delta X$ and $\Delta Y$ of the overall reference mark FM1 from the normal mark position in the left-right direction (hereinafter also referred to as the "X direction") and the front-rear direction (hereinafter also referred to as the "Y direction") are acquired. Note that, to describe the case shown in FIG. 4, positions X and Y are positions with reference to a reference position set with respect to component mounter 12, and position deviation amounts $\Delta X$ and $\Delta Y$ are as shown in the figure. Note that, identification of the reference mark is performed by finding an imaging target of a size and shape that corresponds to the reference mark from the image, based on the size and shape of the reference mark that has been registered in advance.

Figure 4:
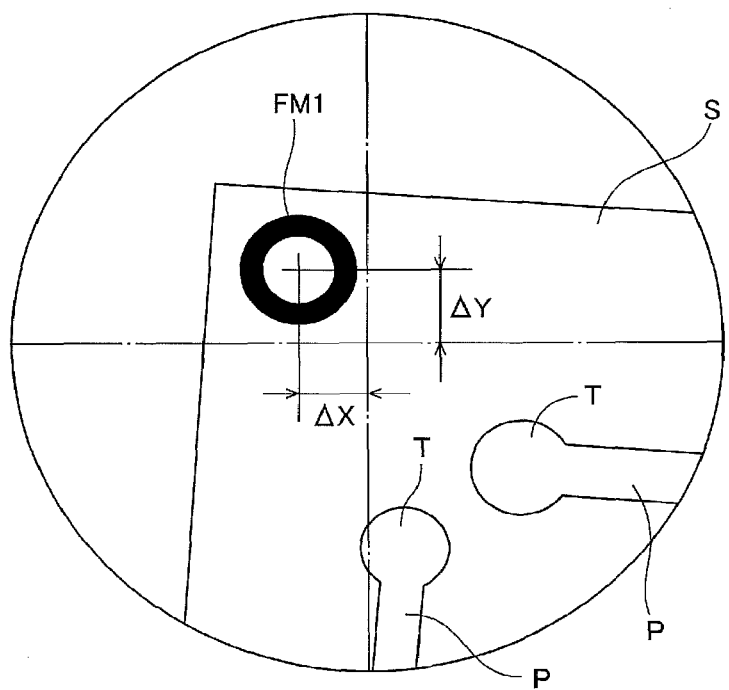
FIG. 4 conceptually shows an example of an image acquired by a camera when a reference mark is imaged.

As understood from FIG. 4, not only reference marks, but also circuit patterns P (also referred to as "lands") are formed on the board, and items other than reference marks are imaged as imaging targets. In the figure, terminals T of circuit patterns P have a similar size and shape to overall reference mark FM1, such that terminal T may be misrecognized as overall reference mark FM1. Considering this, tolerance T$\Delta X \Delta X1$ T$\Delta X1$ and T$\Delta Y1$ are set with respect to the above position deviation amounts $\Delta X$ and $\Delta Y$, and progressing to S3, it is determined whether the position deviation amounts $\Delta X$ and $\Delta Y$ are within the range of set tolerance T$\Delta X1$ and T$\Delta Y1$. If the determination result is that either of position deviation amounts $\Delta X$ and $\Delta Y$ are not within the range of set tolerance T$\Delta XX1$ and T$\Delta Y1$, in S4, it is reported that the reference mark has been misrecognized, and operation of component mounter 12 is stopped.

If both position deviation amounts $\Delta X$ and $\Delta Y$ of the overall reference mark FM1 are within the range of set tolerance T$\Delta X1$ and T$\Delta Y1$, via processing of S5, processing of S1 to S3 is performed on the other of the pair of overall reference marks FM1. In a case in which it is determined that the position deviation amounts $\Delta X$ and $\Delta Y$ are within the range of set tolerance T$\Delta X1$ and T$\Delta Y1$ for both of the pair of overall reference marks FM1, processing of S6 is performed.

In S6, separation distance L (refer to FIG. 2) between the pair of overall reference marks FM1 is acquired based on the positions X and Y acquired in S2, and separation distance difference $\Delta L$ that is the difference between separation distance L and the normal separation distance is acquired as a deviation amount of the relative positions of the pair of overall reference marks FM1 (relative position deviation amount). Set tolerance T$\Delta L1$ is set with respect to this separation distance difference $\Delta L$, and continuing to S7, it is determined whether separation distance difference $\Delta L$ is within the range of set tolerance difference T$\Delta L1$. If the determination result is that separation distance difference $\Delta L$ is not within the range of set tolerance T$\Delta L1$, in S4, it is reported that the reference mark has been misrecognized, and operation of component mounter 12 is stopped. If separation distance difference ΔL is within the range of set tolerance TΔL1, processing of S8 is performed.

In S8, based on positions X and Y of the pair of overall reference marks FM1 acquired in S2, reference coordinates are set for that board. Reference coordinates are set considering the deviation of the position at which the board is fixed, and processing of S9 and on is performed based on the reference coordinates. Specifically, for example, the normal mark position of local area reference marks FM2 described above is a position based on the reference coordinates.

Processing of S10 and on is processing for local area reference marks FM2, and in S9, one area from the multiple local areas A on which to perform processing of S10 and on is identified from areas for which processing of S10 and on has not yet been performed, according to a specified order. Then, processing of S10 to S15 is performed on the identified local area. Processing of S10 to S15 is similar to the processing of S1 to S7 described above, and putting it simply, positions X and Y of local area reference marks FM, position deviation amounts ΔX and ΔY, and separation distance difference ΔL are acquired based on the above reference coordinates of one local area A, it is determined whether the position deviation amounts ΔX and ΔY are within the range of set tolerance difference TΔX2 and TΔY2, and if they are not within the range, it is reported that the reference mark has been misrecognized.

In S16, it is determined whether processing has been performed for all local areas A, such that processing of S10 to S15 is repeated for all local areas A. If recognition processing has been performed favorably for all reference marks, component mounting work is performed for each local area A based on the positions X and Y of the local area reference marks FM2 acquired for each local area A.

With the above processing for recognizing reference marks, processing for checking whether recognized reference marks are those that should have been recognized is performed based on position deviation amounts ΔX and ΔY of the reference marks and separation distance difference ΔL that is the relative position deviation amount, using the corresponding set tolerance differences TΔX1, TΔY1, TΔX2, and TΔY, and set tolerance differences TΔL1 and TΔL2. Specifically, S3, S7, S12, and S15 are check processing for reference marks, and with regard to set tolerance differences TΔX1, TΔY1, TΔX2, and TΔY2, and set tolerance differences TΔL1 and TΔL2 used in this check processing, with component mounter 12, set tolerance differences TΔX2, TΔY2, and TΔL2 for checking local area reference marks FM2 are smaller than set tolerance differences TΔX1, TVY1, and TΔL1, for checking overall reference marks FM1. Accordingly, with component mounter 12, the above processing for checking is performed reliably, as described above.

Note that, as understood from FIG. 2, separation distance L of a pair of local area reference marks FM2 varies depending on factors such as the quantity of local areas A. With component mounter 12, for reasons described above, according to separation distance L of a pair of local area reference marks FM2, set tolerance difference TΔL is set to be larger the larger that separation distance L is, and is set to be smaller the smaller that separation distance L is. This contributes to more reliable check processing of reference marks.

REFERENCE SIGNS LIST

12: component mounter (board work machine); 18: conveyor device (board fixing device); 22: component mounting device (board work device); 32: control device; 36: board camera (imaging device); S: board; A: local area; FM1: overall reference mark; FM2: local area reference mark; ΔX, ΔY: position deviation amount; TΔX1, TΔY1, TΔX2, TΔY2: set tolerance difference; ΔL: separation distance difference (relative position deviation amount); TΔL1, TΔL2: set tolerance

The invention claimed is:

1. A board work machine comprising:
   a board fixing device configured to fix a board;
   a board work device configured to perform work with respect to the board fixed by the board fixing device;
   an imaging device configured to image a surface of the board fixed by the board fixing device;
   a control device configured to recognize an imaging target as a reference mark in a case in which a position deviation amount of the imaging target imaged by the imaging device is within a set tolerance range, and control the board work device to perform work using the recognized reference mark as a reference,
   wherein the board includes an overall reference mark that represents a reference of the board overall and a local area reference mark that represents a reference of a local area, the set tolerance range for recognizing the local area reference mark is smaller than the set tolerance for recognizing the overall reference mark,
   wherein the control device determines whether a position deviation amount of the overall reference mark is within the set tolerance for recognizing the overall reference mark and determines whether a position deviation amount of the local reference mark is within the set tolerance for recognizing the local reference mark, and
   wherein the control device stops operation of the board work device if either of the position deviation amount of the overall reference mark and the position deviation amount of the local reference mark are outside the respective set tolerance.

2. The board work device according to claim 1, wherein, the board includes a pair of overall reference marks separated from each other as the overall reference mark, and a pair of local area reference marks that are separated from each other with respect to one local area as the local area reference mark,
   the set tolerance for recognizing the overall reference mark, as a set tolerance of the relative position deviation amount of the pair of overall marks, includes a set tolerance with respect to a separation distance of the pair of overall reference marks, and the set tolerance for recognizing the local area reference marks, as a set tolerance of the relative position deviation amount of the pair of local area reference marks, includes a set tolerance with respect to a separation distance of the pair of local areas reference marks, and
   the set tolerance with respect to the separation distance of the pair of local areas reference marks is smaller than the set tolerance with respect to the separation distance of the pair of overall reference marks.

3. The board work machine according to claim 2, wherein the set tolerance with respect to the separation distance of the pair of overall reference marks and the set tolerance with respect to the separation distance of the pair of local areas reference marks are set to a size according to the respective separation distance of each.

* * * * *